(12) United States Patent
Schulze et al.

(10) Patent No.: US 9,177,829 B2
(45) Date of Patent: Nov. 3, 2015

(54) SEMICONDUCTOR COMPONENT HAVING A PASSIVATION LAYER AND PRODUCTION METHOD

(71) Applicant: Infineon Technologies AG, Neubiberg (DE)

(72) Inventors: Hans-Joachim Schulze, Taufkirchen (DE); Manfred Pfaffenlehner, Munich (DE); Markus Schmitt, Neubiberg (DE)

(73) Assignee: Infineon Technologoies AG, Neubiberg (DE)

( * ) Notice: Subject to any disclaimer, the term of this patent is extended or adjusted under 35 U.S.C. 154(b) by 0 days.

(21) Appl. No.: 14/485,852

(22) Filed: Sep. 15, 2014

(65) Prior Publication Data

US 2015/0076597 A1     Mar. 19, 2015

(30) Foreign Application Priority Data

Sep. 16, 2013  (DE) .......................... 10 2013 218 494

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 21/322* | (2006.01) |
| *H01L 29/32* | (2006.01) |
| *H01L 29/78* | (2006.01) |
| *H01L 29/872* | (2006.01) |
| *H01L 23/29* | (2006.01) |
| *H01L 21/31* | (2006.01) |
| *H01L 29/861* | (2006.01) |
| *H01L 23/31* | (2006.01) |
| *H01L 29/06* | (2006.01) |

(52) U.S. Cl.
CPC ............ *H01L 21/3221* (2013.01); *H01L 21/31* (2013.01); *H01L 23/291* (2013.01); *H01L 23/3171* (2013.01); *H01L 23/3192* (2013.01); *H01L 29/32* (2013.01); *H01L 29/7801* (2013.01); *H01L 29/8611* (2013.01); *H01L 29/872* (2013.01); *H01L 29/0619* (2013.01); *H01L 29/0657* (2013.01)

(58) Field of Classification Search
CPC ....... H01L 29/76; H01L 29/94; H01L 29/739; H01L 29/7802; H01L 29/66712; H01L 29/7385
USPC ................... 257/335, 587, E21.382; 438/353
See application file for complete search history.

(56) References Cited

U.S. PATENT DOCUMENTS 5,455,437 A * 10/1995 Komori et al. ................ 257/376
5,677,562 A   10/1997 Korwin-Pawlowski et al.
(Continued)

FOREIGN PATENT DOCUMENTS

DE    1910746 A1    3/1970
DE    3851271 T2    4/1995
(Continued)

*Primary Examiner* — Phuc Dang
(74) *Attorney, Agent, or Firm* — Eschweiler & Associates, LLC (57) ABSTRACT

A semiconductor component and a method for producing a semiconductor component are described. The semiconductor component includes a semiconductor body including an inner zone and an edge zone, and a passivation layer, which is arranged at least on a surface of the semiconductor body adjoining the edge zone. The passivation layer includes a semiconductor oxide and that includes a defect region having crystal defects that serve as getter centers for contaminations.

26 Claims, 5 Drawing Sheets

(56) References Cited

U.S. PATENT DOCUMENTS

2013/0307127 A1* 11/2013 Schulze et al. ............... 257/644
2015/0001719 A1* 1/2015 Schmidt et al. .............. 257/751

FOREIGN PATENT DOCUMENTS

DE 102006025135 A1 12/2007
DE 102006046853 A1 4/2008

* cited by examiner

SEMICONDUCTOR COMPONENT HAVING A PASSIVATION LAYER AND PRODUCTION METHOD

REFERENCE TO RELATED APPLICATION

This application claims priority to German application number 10 2013 218 494.8 filed on Sep. 16, 2013.

FIELD

Exemplary embodiments of the present disclosure relate to a semiconductor component, in particular a power semiconductor component, having a passivation layer and to a method for producing a semiconductor component having a passivation layer.

BACKGROUND

Power semiconductor components, such as, for example, power diodes, power MOSFETs (Metal Oxide Semiconductor Field Effect Transistors), power IGBTs (Insulated Gate Bipolar Transistors) or power thyristors, have been developed to withstand high reverse voltages. Such power components comprise a pn junction formed between a p-doped semiconductor zone and an n-doped semiconductor zone. The component is in the off state (is switched off) if the pn junction is reverse-biased. In this case, a depletion zone or space charge zone propagates in the p-doped and n-doped zones. Usually, one of said semiconductor zones is more lightly doped than the other of said semiconductor zones, with the result that the depletion zone propagates principally in the more lightly doped zone, which principally accepts the voltage present across the pn junction.

In the case of vertical power semiconductor components, terminals for applying an electrical voltage to the pn junction are usually arranged on opposite sides of a semiconductor body in which the pn junction is integrated. In this case, the semiconductor body comprises an inner region (an inner zone), in which the pn junction is arranged, and an edge region (an edge zone), which surrounds the inner region in a ring-shaped fashion. With the component in the off state, the equipotential lines of the electric field in the inner region run substantially parallel to a front side and a rear side of the semiconductor body i.e. the electric field lines run perpendicular to the front and rear sides, while the equipotential lines in the edge region emerge from the semiconductor body in the region of one of the front and rear sides. In many cases it is desirable to achieve in the edge region of the component a dielectric strength which corresponds at least to the dielectric strength in the inner region. On account of the equipotential lines emerging from the semiconductor body in the edge region, i.e. on account of the electric field lines running parallel to the surface in the edge region, the dielectric strength of the component can be adversely influenced by parasitic effects in the region of the surface of the semiconductor body, such as e.g. free bonds of the semiconductor atoms of the semiconductor body. In principle, these effects can be reduced by providing a passivation on the surface of the semiconductor body in the edge region. This is described for example in B. Jayant Baliga: "Fundamentals of Power Semiconductor Devices", Springer Verlag, 2008, ISBN 978-0-387-47313-0, pages 125-155.

One suitable material for a passivation layer is a semiconductor oxide for example. However, even under optimum production conditions in an extremely clean atmosphere, contaminations of the passivation layer cannot completely be avoided. Such contaminations can lead to positive charges or negative charges in the passivation layer. In this regard, positive charges can be brought about for example by a contamination with alkali metal ions, such as, for example, sodium (Na) ions or potassium (K) ions, and negative charges can be brought about for example by a contamination with hydroxide ions (OH$^-$). Under the influence of high electric fields such as occur with the component in the off state, for example, said charges can be displaced or can accumulate, which can lead to an unfavorable field distribution that reduces the dielectric strength of the component in the edge region.

SUMMARY

The problem addressed by the present disclosure is to provide a semiconductor component having a passivation layer wherein the disadvantages mentioned above do not occur or occur only to a lesser extent, and to provide a method for producing a semiconductor component having such a passivation layer.

This problem is solved by means of a semiconductor component as claimed in claim 1 and by means of a method as claimed in claim 15. Dependent claims relate to configurations and developments.

A semiconductor component in accordance with one exemplary embodiment of the disclosure comprises a semiconductor body comprising an inner zone and an edge zone, and a passivation layer. The passivation layer is arranged on at least one surface of the semiconductor body adjoining the edge zone, comprises a semiconductor oxide and comprises a defect region having crystal defects that serve as getter centers for contaminations.

A method in accordance with one exemplary embodiment of the disclosure for producing a semiconductor component comprising a semiconductor body having an inner region and an edge region comprises producing a passivation layer at least on a surface of the semiconductor body adjoining the edge zone. The passivation layer comprises a semiconductor oxide and comprises a defect region having crystal defects that serve as getter centers for contaminations.

BRIEF DESCRIPTION OF THE DRAWINGS

Examples are explained below with reference to drawings. The drawings serve to elucidate the basic principle, and so only those aspects which are necessary for understanding the basic principle are illustrated. The drawings are not true to scale. In the drawings, identical reference signs designate identical features.

DETAILED DESCRIPTION

In the following detailed description, reference is made to the accompanying drawings, which form a part thereof and which illustrate for clarification purposes specific exemplary embodiments of how the disclosure can be realized. It goes without saying that the features of the different exemplary embodiments can be combined with one another, unless indicated otherwise and insofar as these features are not mutually exclusive.

Figure 1:
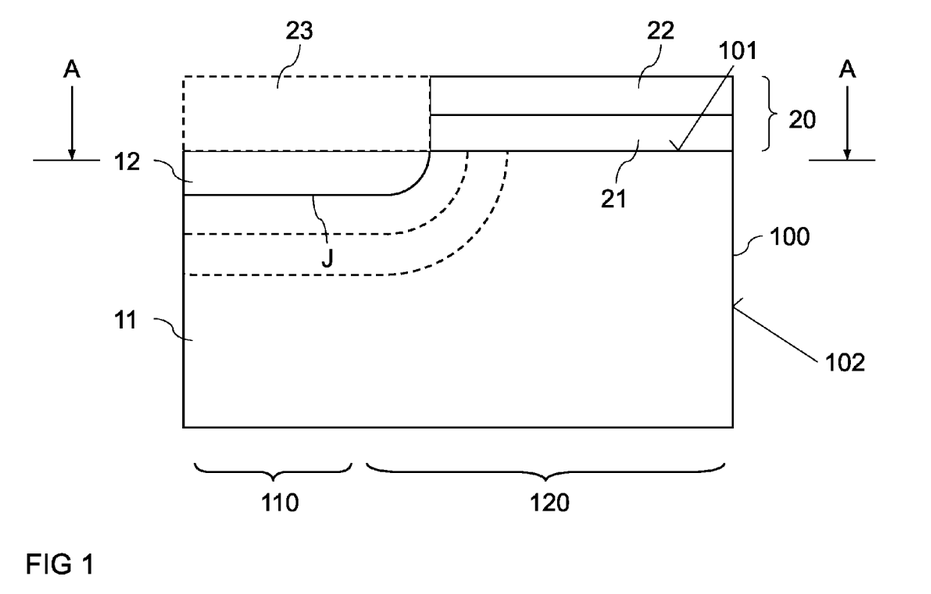
FIG. 1 shows a vertical cross section through a semiconductor component having a passivation layer in accordance with one exemplary embodiment.
Figure 2:
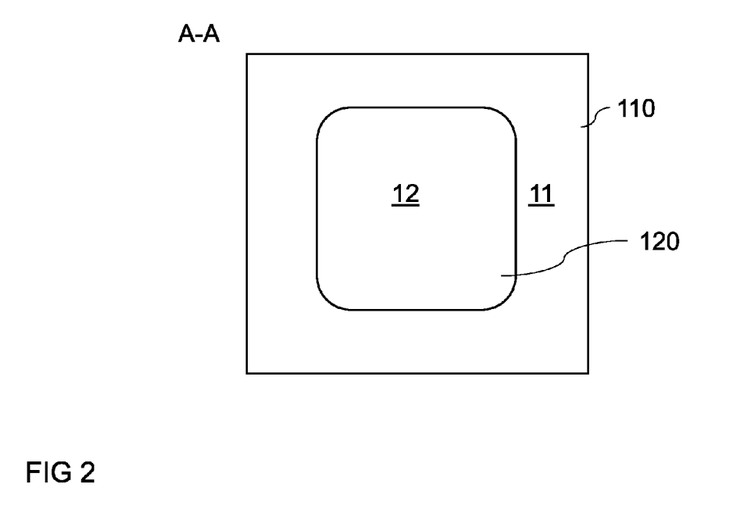
FIG. 2 schematically shows a horizontal cross section through a semiconductor body of the semiconductor component in accordance with FIG. 1.

FIG. 1 shows a vertical cross section of part of a semiconductor component. The semiconductor component comprises a semiconductor body 100 having an inner zone 110 and an edge zone 120. Referring to FIG. 2, which shows a horizontal cross section of the semiconductor body 100 in a sectional plane A-A depicted in FIG. 1, the edge region 120 can surround the inner region 110 in a ring-shaped fashion in the horizontal plane.

As will be explained below, active component zones of a semiconductor component, in particular of a power semiconductor component, can be arranged in the inner region 110. The edge region 120 can be a region of the semiconductor body 100 between the inner region 110 and an edge surface 102 of the semiconductor body 100 if only one semiconductor component is integrated in the semiconductor body 100. However, it is also possible to integrate a plurality of semiconductor components in the semiconductor body 100. In this case, a plurality of inner regions each surrounded by an edge region are present. The individual edge regions are then arranged in each case between two inner regions or between an inner region and an edge surface of the semiconductor body.

The semiconductor body 100 comprises a conventional semiconductor material such as, for example, silicon (Si), silicon carbide (SiC), gallium nitride (GaN) or the like. FIG. 1 shows a vertical cross section through said semiconductor body 100, i.e. a cross section in a sectional plane running perpendicularly to a first side 101 of the semiconductor body 100. This first side 101 is also designated hereinafter as the front side.

In accordance with one exemplary embodiment, at least one rectifying component junction between a first doped component zone 11 of a first doping type and a second component zone 21 is arranged in the inner region 110 of the semiconductor body 100. The component junction J is either a pn junction or a Schottky junction. In the first case, the second component zone 12 is a semiconductor zone of a second doping type complementary to the first doping type. In the second case, the further component zone 12 is a Schottky zone or a Schottky metal such as, for example, aluminum (Al), tungsten silicide (WSi), tantalum silicide (TaSi), titanium silicide (TiSi), platinum silicide (PtSi) or cobalt silicide (CoSi).

Terminals of the semiconductor component which make contact with these component zones 11, 12 forming the component junction J are not illustrated in FIG. 1.

In the case where a voltage that reverse-biases the component is applied between the first component zone 11 and the second component zone 12, a space charge zone propagates in the first component zone 11 and the second component zone 12. For explanation purposes, it shall be assumed that the first component zone 11 is significantly more lightly doped than the second component zone 12. In this case, the space charge zone substantially propagates in the more lightly doped first semiconductor zone 11. The doping concentration of the first semiconductor zone 11 is for example less than $10^{14}$ cm$^{-3}$, in particular less than $10^{13}$ cm$^{-3}$, while the doping concentration of the second component zone 12 is for example higher than $10^{18}$ cm$^{-3}$ or even higher than $10^{19}$ cm$^{-3}$.

FIG. 1 schematically illustrates equipotential lines of an electric field which is related to the space charge zone propagated in the first component zone 11. In the case of the exemplary embodiment illustrated in FIG. 1, the second component zone 12 is arranged only in the inner region 110 of the semiconductor body 100, but not in the edge region 120. In this case, the equipotential lines run in the edge region 120 of the semiconductor body 100 as far as the front side 101, where they emerge from the semiconductor body 100 (not illustrated). Electric field lines of the electric field run perpendicularly to the equipotential lines, such that in the edge region 120 of the semiconductor body 100 an electric field is present whose field lines run substantially parallel to the front side 101. The maximum electric field strength occurring in the edge region 120 of the semiconductor body 100 substantially corresponds to the maximum electric field strength occurring in the inner region 110 in the first component zone 11. In the edge region 120 of the component, additional measures can be taken which bring about a "widening" of the equipotential lines in the edge region 120 and thus a reduction of the electric field strength in comparison with the inner region 110. It is thereby possible to ensure that a voltage breakdown in the event of the maximum reverse voltage strength of the component being exceeded occurs firstly in the inner region 110, and not in the edge region 120. The maximum reverse voltage strength of the component defines the maximum voltage which can be applied between the first component zone 11 and the second component zone 12 before an avalanche breakdown commences and the component breaks down. Said maximum reverse voltage strength can be a few 10 V, a few 100 V or even a few kilovolts (kV), depending on the doping concentration of the first component zone 11 and depending on the dimensioning of the first component zone 11 in a vertical direction of the semiconductor body 100, that is to say a direction perpendicular to the front side 101.

Since, in the manner explained, high field strengths can occur in the edge region 120 in the region of the front side 101 if the component junction J is reverse-biased, a passivation layer 20 is provided on the front side 101 at least in the edge region 120, which passivation layer is intended to prevent the occurrence of voltage flashovers along the front side 101. Voltage flashovers can occur even at comparatively low field strengths for example if, during the operation of the semiconductor component, moisture or undesired charges in the edge region 120 were to pass as far as the front side 101 or close to the front side of the semiconductor body 100.

One exemplary embodiment provides for the passivation layer 20 to comprise a semiconductor oxide. Said semiconductor oxide is for example a silicon oxide ($SiO_2$), a silicate glass (SG), a silicon oxide doped with phosphorus (phosphosilicate glass, PSG), a silicon oxide doped with boron (borosilicate glass, BSG) or a silicon oxide doped with boron and phosphorus (borophosphosilicate glass, BPSG). The doping concentration of the impurity, i.e. in the examples mentioned the doping concentrations of boron, phosphorus or boron and phosphorus, are for example in each case more than 2%, such as, for example, between 2% and 6%. That is to say that, in the case of BPSG, the concentration of boron and phosphorus is in each case more than 2%.

In such a passivation layer 20, electrical charges can be combined which can result from virtually unavoidable contaminations during the process of producing the passivation layer 20. Said electrical charges can be positive electrical charges, which can result for example from the presence of alkali metal ions, such as sodium ions or potassium ions, for example in the passivation layer 20, or can be negative charges, which can be caused by hydroxide ions ($OH^-$ ions), for example. Under the influence of the electric field which can occur in the edge region 120 with the component in the off state and which is also present in the passivation layer, said electrical charges can be displaced within the passivation layer 20 and can accumulate for example at specific locations of the passivation layer 20. This can in turn lead to an influencing of the electric field strength in the underlying edge region 120, and thus to an influencing of the reverse voltage strength of the component in the edge region 120, and this will be all the more pronounced, the nearer said charges approach the semiconductor interface.

In order to prevent an adverse effect of such unavoidable contaminations on the reverse voltage strength of the component the passivation layer 20 illustrated in FIG. 1 comprises a defect region having crystal defects that serve as getter centers (trapping centers) for contaminations, such as alkali metal ions or hydroxide ions, for example. The passivation layer 20 illustrated in FIG. 1 comprises two sublayers, namely a first sublayer 21, which adjoins the front side 101 of the semiconductor body 100, and a second sublayer 22, which is arranged on the first sublayer 21 and which is separated from the semiconductor body 100 by the first sublayer 21. In this exemplary embodiment, the defect region having the crystal defects is arranged in the second sublayer 22. The crystal defects are for example lattice displacements, lattice strains, such as lattice strains caused by impurity atoms, for example, or precipitates of impurity atoms.

The crystal defects acting as getter centers are able to "trap" or permanently bind externally penetrating contaminations or contaminations already present in the layer 21, such as, for example, the alkali metal ions and hydroxide ions mentioned above. This prevents the contaminations from accumulating at a specific location of the passivation layer 20. Contaminations from the lower sublayer 21 pass principally by diffusion to the getter centers in the upper sublayer 22 and are then retained there.

In the exemplary embodiment in accordance with FIG. 1, the passivation layer 20 is present only above the edge region 120. However, this is just one example. As is illustrated by dashed lines in FIG. 1, a passivation layer 23 can also be provided above the inner region 110. Said passivation layer 23 above the inner region 110 can be embodied in a manner corresponding to the passivation layer 20 in the edge region 120, that is to say that said passivation layer 23 can likewise comprise two sublayers, namely a sublayer adjoining the front side 101 and having no crystal defects or only having few crystal defects and a second sublayer arranged above said first sublayer and having a defect region having crystal defects. In a further exemplary embodiment, the passivation layer 23 above the inner region 110 is embodied in a manner corresponding to the first sublayer 21, that is to say has no crystal defects or only few crystal defects.

The concentration of crystal defects in the second sublayer 22 is for example more than $1E14\ cm^{-3}$, more than $1E16\ cm^{-3}$, or more than $1E18\ cm^{-3}$. The first sublayer 21 has no crystal defects or only few crystal defects. The ratio between the concentration of crystal defects in the first sublayer 21 and the second sublayer 22 is for example less than $1/100$, less than $1/1000$ or even less than $1/10000$.

Figure 3:
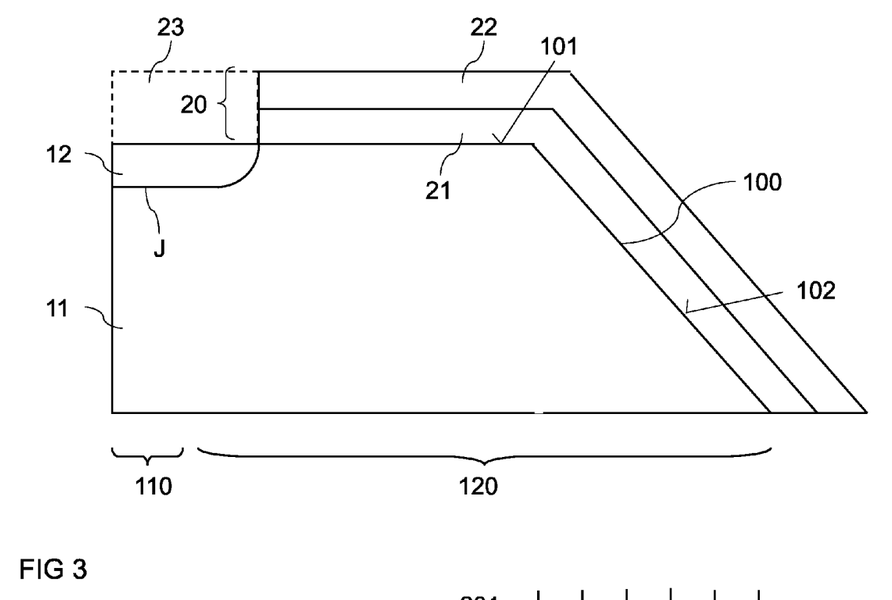
FIG. 3 shows a vertical cross section of a semiconductor component having a passivation layer in accordance with a further exemplary embodiment.

Even though the passivation layer 20 in the case of the semiconductor component in accordance with FIG. 1 is arranged only above the front side 101 of the semiconductor body 100, the passivation layer 20 is, of course, not restricted thereto. FIG. 3 shows a vertical cross-sectional view of an edge region 120 of a further semiconductor component. In the case of this semiconductor component, the passivation layer 20 is arranged in the edge region 120 both on the front side 101 of the semiconductor body 100 and on an obliquely extending side surface 102 of the semiconductor body 100. As in the case of the exemplary embodiment explained with reference to FIG. 1, the passivation layer 20 comprises two sublayers 21, namely a first sublayer having a low defect concentration and a second sublayer 22 arranged on the first sublayer 21 and having a high defect concentration in comparison with the first sublayer 21. With regard to the composition of the first and second sublayers 21, 22 and with regard to the defect concentrations, the explanations given in connection with FIG. 1 correspondingly apply to the exemplary embodiment in accordance with FIG. 3.

As in the case of the exemplary embodiment in accordance with FIG. 1, in the case of the exemplary embodiment in accordance with FIG. 3, too, a passivation layer 23 can be provided above the inner region 110 of the semiconductor body 100. The explanations concerning said passivation layer 23 as given in connection with FIG. 1 correspondingly apply to the passivation layer 23 in accordance with FIG. 3.

Figure 4A:
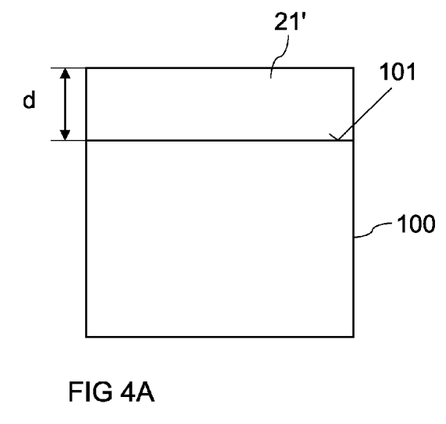
FIGS. 4A-4B shows a vertical cross section of part of a semiconductor component during different method steps of one exemplary embodiment of a method for producing a semiconductor component having a passivation layer.
Figure 4B:
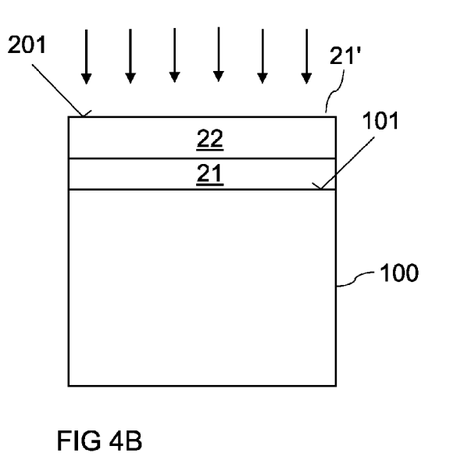

One exemplary embodiment of a method for producing the passivation layer 20 is explained below with reference to FIGS. 4A and 4B. The semiconductor body 100 is illustrated only schematically in FIGS. 4A and 4B. Doped semiconductor regions within said semiconductor body 100 are not shown. Moreover, only the front side 101 of the semiconductor body 100 is illustrated in FIGS. 4A and 4B. An obliquely extending side surface 102 that is possibly present is not shown.

Referring to FIG. 4A, the method comprises producing an oxide layer 21' on the front side 101 of the semiconductor body 100. Said oxide layer 21' can be an undoped semiconductor oxide (silicon oxide, $SiO_2$) or a semiconductor oxide doped with boron and/or phosphorus (BSG, PSG, BPSG). Said oxide layer 21' can be produced by a thermal oxidation method or by a CVD method, wherein, in the case of a thermal oxidation method, the oxidation atmosphere contains, if appropriate, boron and/or phosphorus.

A thickness d of the oxide layer 21', i.e. a dimension of said oxide layer 21' in a direction perpendicular to the front side 101, is for example between 100 nanometers (nm) and 5 micrometers (μm), in particular between 200 nanometers and 2 micrometers.

Referring to FIG. 4B, a damage implantation is subsequently carried out, wherein impurity atoms are implanted into the oxide layer 21' via a side 201 of the oxide layer 21' facing away from the front side 101 of the semiconductor body 100. In this case, the implantation energy with which the impurity atoms are implanted into the oxide layer 21' is chosen such that, as a result of the implantation, crystal defects arise in a region of the oxide layer 21' adjoining the surface 201, while the impurity atoms do not penetrate into deeper regions of the oxide layer 21' adjoining the front side 101. Such regions of the oxide layer 21' in which crystal defects are produced form the second sublayer 22 of the passivation layer, while the regions of the oxide layer 21' which adjoin the front side 101 and in which no crystal defects are produced form the first sublayer 21 of the passivation layer 20. The first sublayer 21 thus corresponds to a portion of the oxide layer 21' which was not altered by the implantation of the impurity atoms.

An implantation dose of the impurity atoms (a quantity of impurity atoms per unit area) is for example between 1E13 $cm^{-2}$ and 1E16 $cm^{-2}$. The implementation energy, that is to say the energy with which the impurity atoms are implanted, is for example between 100 keV and 4 MeV, and in particular between 170 keV and 3 MeV. The implantation energy is dependent, in particular, on the type of implanted impurity atoms and on the depth to which the impurity atoms are intended to be implanted into the oxide layer 21'. It generally holds true that, for a given type of impurity atoms, the impurity atoms are implanted into the oxide layer 21' all the more deeply the higher the implantation energy. In one exemplary embodiment, the implantation energy is additional chosen in a manner dependent on the thickness of the oxide layer 21' such that the impurity atoms do not pass as far as the front side 101 of the semiconductor body 100, that is to say that a portion of the oxide layer 21' remains into which no impurity atoms are introduced.

Suitable impurity atoms for damaging the crystal lattice in the second sublayer 22 are for example semiconductor atoms, such as for example silicon atoms, oxygen atoms, argon atoms, helium atoms, protons, phosphorus atoms, or the like. The implanted impurity atoms lead to damage to the crystal lattice of the oxide layer 21', wherein such damaged regions of the crystal lattice (crystal defects) serve as effective getter centers for contaminations.

Figure 5A:
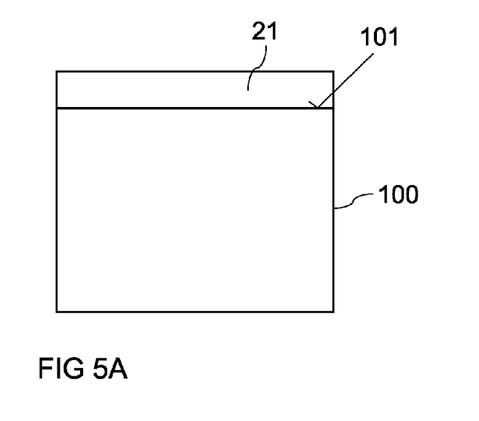
FIGS. 5A-5B shows a vertical cross section of part of a semiconductor component during different method steps of another exemplary embodiment of a method for producing a semiconductor component having a passivation layer.

FIGS. 5A and 5B illustrate a further method for producing a passivation layer 20 containing a defect region having crystal defects. Referring to FIG. 5A, this method provides for producing a first sublayer 21 on the front side 101 of the semiconductor body 100. Said first sublayer 21 can be produced in a manner corresponding to the oxide layer 21' in accordance with FIG. 4A and can be for example an undoped or a doped oxide layer. The thickness of the first sublayer is for example between 50 nm (nanometers), and 1500 nm, in particular between 100 nm and 500 nm.

Figure 5B:
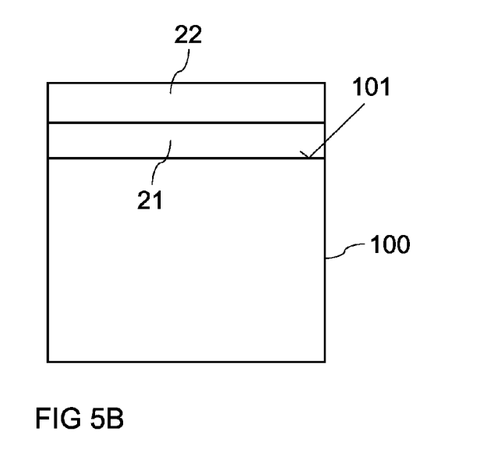

Referring to FIG. 5B, the second sublayer 22, which comprises at least one defect region having crystal defects, is produced on the first sublayer 21. The second sublayer 22 comprises for example an undoped semiconductor oxide (such as for example $SiO_2$), or a semiconductor oxide doped with boron and/or phosphorus (such as for example BSG, PSG or BPSG). Producing said second sublayer 22 comprises a plasma deposition method, for example. Unlike in the case of a thermal oxidation method or a CVD method, an oxide layer produced by a plasma deposition method has a comparatively high density (concentration) of crystal defects, and so such an oxide layer produced by a plasma deposition method is suitable as the second sublayer 22 of the passivation layer 20. The thickness of the second sublayer 22 is for example between 100 nanometers and 2 micrometers, in particular between 150 nanometers and 1 micrometer. In the case of a doped oxide layer, the boron and/or phosphorus concentration is for example in each case between 2% and 6%.

In a further exemplary embodiment, provision is made for introducing further impurity atoms that can serve as getter centers for contaminations in that region of the passivation layer 20 which contains the defection region, that is to say into the second sublayer 22 in the case of the exemplary embodiments explained above. Such impurity atoms are for example argon atoms, hydrogen atoms, carbon atoms. Said impurity atoms can be incorporated stably into the lattice of the passivation layer 20. In the case of the method explained with reference to FIGS. 4A and 4B, said impurity atoms can be implanted into the second sublayer 22 via the front side 201. In the case of the method explained with reference to FIGS. 4A and 4B, said impurity atoms can be added to the process gas during the plasma deposition. In a further exemplary embodiment (not illustrated) of the passivation layer 20, the second sublayer 22 having crystal defects directly adjoins the front side 101 of the semiconductor body.

Figure 6:
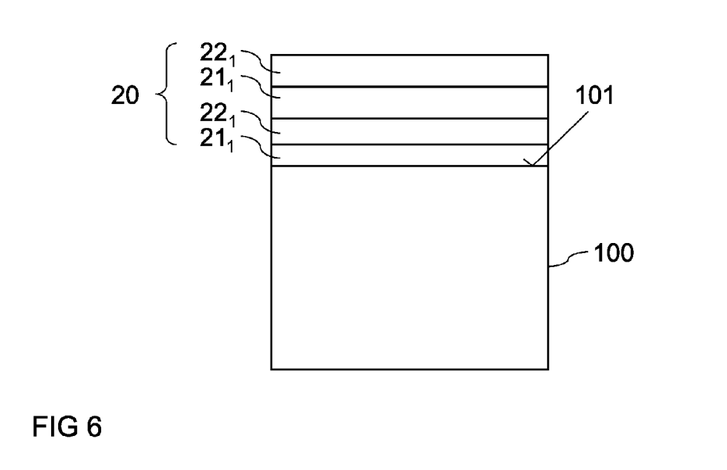
FIG. 6 shows a vertical cross section through a semiconductor component having a passivation layer in accordance with a further exemplary embodiment.

The passivation layer 20 is not restricted to having only one sublayer having a defect region, but rather can also be realized with a plurality of such sublayers. FIG. 6 shows a vertical cross section of such a passivation layer 20 arranged on a side 101 of a semiconductor body 100 and comprising a plurality of sublayers having defect regions. The passivation layer 20 illustrated in FIG. 6 comprises a layer stack which alternately comprises first sublayers $21_1$, $21_2$ having a low defect concentration and second sublayers $22_1$, $22_2$ having a high defect concentration in comparison with the first sublayers $21_1$, $21_2$. With regard to the properties and compositions of the first sublayers $21_1$, $21_2$, the explanations given above in respect of the first sublayer 21 correspondingly apply. For the properties and the composition of the second sublayers $22_1$, $22_2$, the explanations given above in connection with the second sublayer 22 correspondingly apply.

Even though only two first sublayers $21_1$, $21_2$ and two second sublayers $22_1$, $22_2$ are illustrated in the case of the exemplary embodiment in accordance with FIG. 6, the passivation layer 20 is not restricted thereto. It is also possible for more than two first and second sublayers to be provided.

The passivation layer 20 in accordance with FIG. 6 can be produced by the method explained with reference to FIGS. 4A and 4B by virtue of the method steps explained with reference to FIGS. 4A and 4B being carried out successively a number of times (twice in the case of the example in accordance with FIG. 6). Alternatively, the passivation layer 20 in accordance with FIG. 6 can be produced by the method explained with reference to FIGS. 5A and 5B by virtue of the method steps described there being carried out successively a number of times (twice).

In a manner not illustrated in more specific detail, at least one further passivation layer, such as a nitride layer and/or an undoped oxide (silicate glass) for example, can be produced on the passivation layer 20.

The passivation layer 20 explained above can be part of an arbitrary edge termination structure of a semiconductor component. Two examples of such edge termination structures are illustrated in FIGS. 7 and 8, which each show a vertical cross section through the edge region 120 of a semiconductor component.

Figure 7:
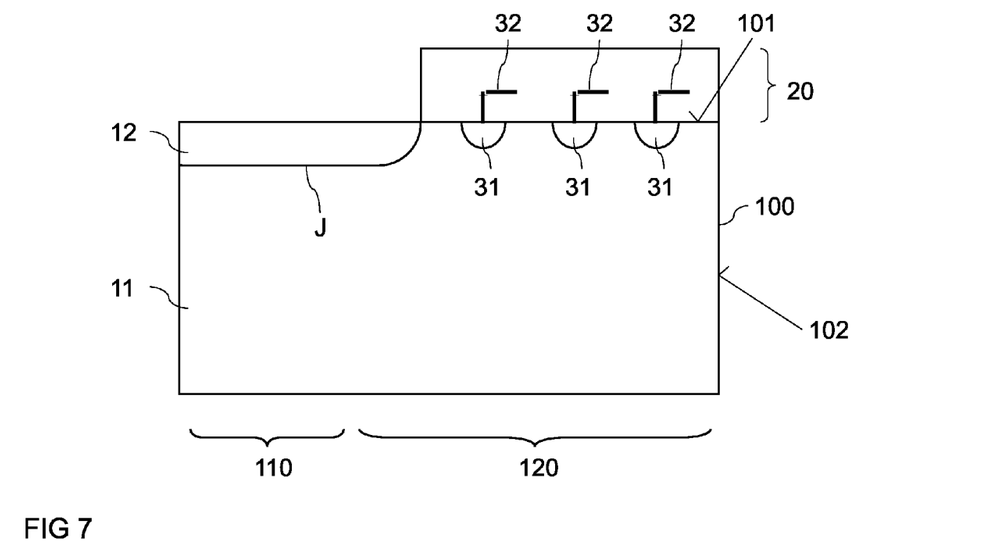
FIG. 7 shows a vertical cross section of an edge region of a semiconductor component comprising an edge termination structure in accordance with one exemplary embodiment in the edge region.

Referring to FIG. 7, the edge termination structure of the semiconductor component can comprise at least one field ring 31 which surrounds the inner region 110 of the semiconductor component in a ring-shaped fashion in a manner not illustrated in more specific detail. Said field ring 31 is doped complementarily to the first component zone 11. Optionally, a field plate 32 is connected to the at least one field ring 31.

Said field plate 32 is arranged above the front side 101 and embedded into the passivation layer 20. As is illustrated in FIG. 7, the component can comprise more than one field ring 31, wherein the individual field rings 31 are arranged at a distance from one another in a direction facing away from the inner region 110.

Figure 8:
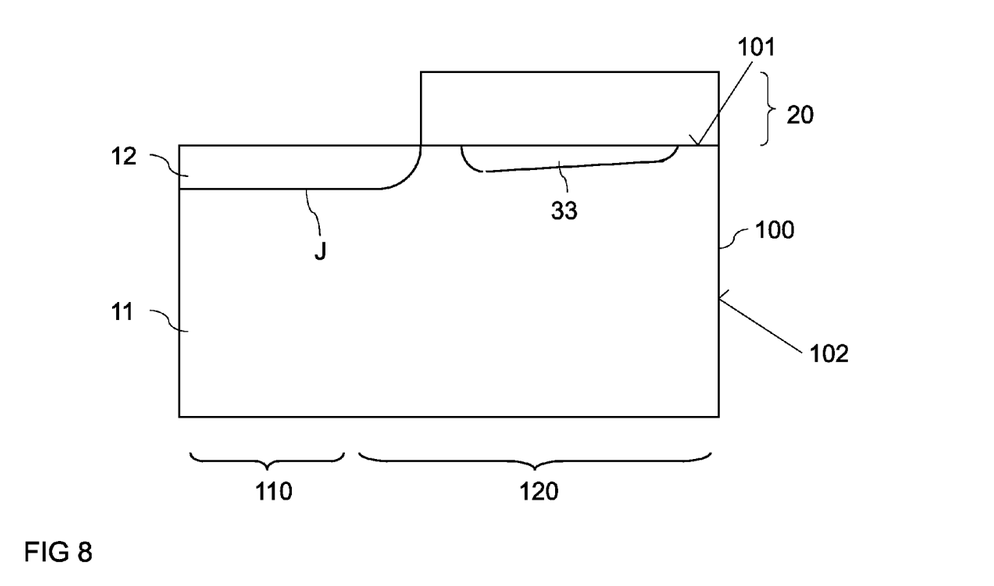
FIG. 8 shows a vertical cross section of an edge region of a semiconductor component comprising an edge termination structure in accordance with another exemplary embodiment in the edge region.

In the case of the semiconductor component illustrated in FIG. 8, the edge termination structure comprises a VLD (Variation of Lateral Doping) zone surrounding the inner region 110 in a ring-shaped fashion in a manner not illustrated in more specific detail. Said VLD zone has a complementary doping with respect to the first component zone 11 and a doping concentration or doping dose that decreases in a direction facing away from the inner region 110.

Figure 9:
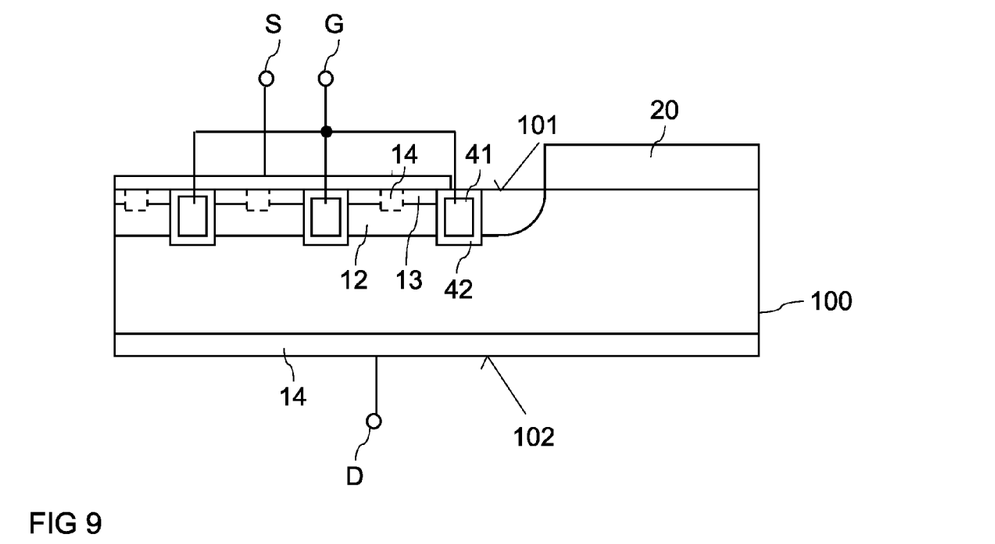
FIG. 9 schematically shows a vertical cross section through an edge region and part of an inner region of a semiconductor component embodied as a MOS transistor.
Figure 10:
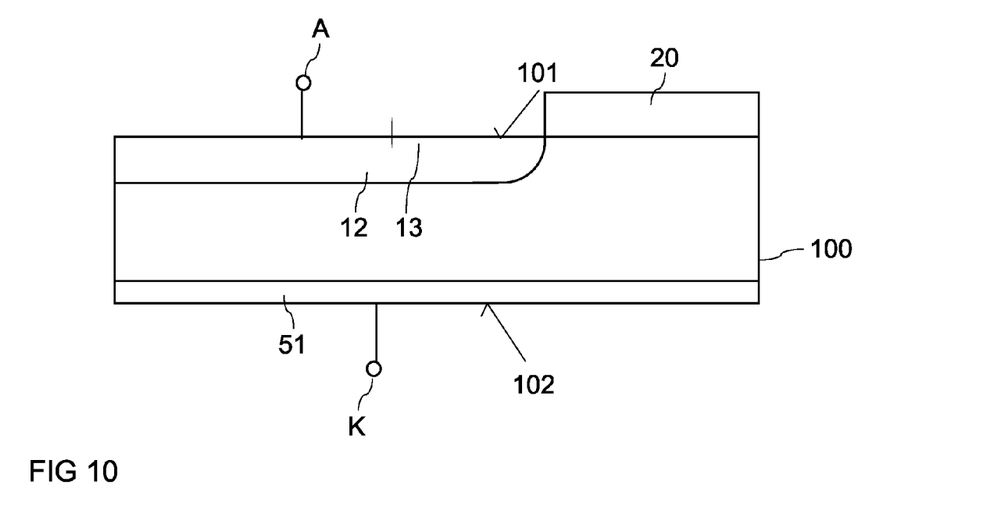
FIG. 10 schematically shows a vertical cross section through an edge region and part of an inner region of a semiconductor component embodied as a diode.

An edge termination structure comprising the passivation layer 20 explained above is suitable for arbitrary semiconductor components, in particular for vertical semiconductor components. Two examples of such semiconductor components are illustrated in FIGS. 9 and 10. FIGS. 9 and 10 each illustrate a vertical cross section through the edge region 120 and an excerpt from the inner region 110 of a vertical power component. In these exemplary embodiments, the passivation layer 20 is illustrated only above the front side 101 of the semiconductor body 100; moreover, no further edge termination structures, such as a field ring or a VLD zone, are illustrated. It goes without saying that the edge termination structures illustrated in FIGS. 9 and 10 can be modified in accordance with the exemplary embodiments explained above.

The semiconductor component illustrated in FIG. 9 is embodied as a MOS transistor and comprises in the inner region 110 of the semiconductor body a cell array having a multiplicity of transistor cells that share a drift zone 11. Said drift zone 11 is formed by the first component zone 11 explained above. The individual transistor cells additionally comprise a body zone 12 and a source zone 13, which is separated from the drift zone 11 by the body zone 12. The individual body zones 12 correspond to the second component zone explained above and form a pn junction with the drift zone 11. The individual transistor cells additionally each comprise a gate electrode 41, which is dielectrically isolated from the semiconductor body 100 by a gate dielectric 42 and is arranged adjacent to the body zone 12. The individual transistor cells are connected in parallel by virtue of the gate electrodes 41 being connected to a common gate terminal G (only illustrated schematically) and by virtue of the individual source and body zones 12, 13 being connected to a common source terminal S (only illustrated schematically). The body zones 12 can be connected to the source electrode S via contact zones 14 of the same conduction type as the body zones. In the exemplary embodiment illustrated, the gate electrodes 41 are embodied as trench electrodes, that is to say are arranged in a trench extending into the semiconductor body 100 proceeding from the front side 101. However, the realization of the gate electrodes 41 as trench electrodes is just one example. Said gate electrodes can also be formed with a different electrode topology, for example as planar electrodes above the front side 101.

Referring to FIG. 9, the MOS transistor additionally comprises a drain zone 14. Said drain zone 14 can adjoin the drift zone 11 (as illustrated). Optionally, a field stop zone (not illustrated) of the same conduction type as the drift zone 11 can be provided between the drift zone 11 and the drain zone 14, wherein the field stop zone is more highly doped than the drift zone 11. The drain zone 14 is connected to a drain terminal D (illustrated schematically).

The MOS transistor can be embodied as an n-conducting or as a p-conducting MOS transistor. In the case of an n-conducting MOS transistor, the source zones 13 and the drift zone 11 are n-doped, while the body zone 12 is p-doped. In the case of a p-conducting MOS transistor, the source zones 13 and the drift zone 11 are p-doped, while the body zones 12 are n-doped. In addition, the component can be embodied as a MOSFET or as an IGBT. In the case of a MOSFET, the drain zone 14 is of the same conduction type as the drift zone 11 and the source zones 13. In the case of an IGBT, the drain zone 14 (which in this case is also designated as the emitter zone) is doped complementarily to the drift zone 11 and the source zones 13. The doping concentration of the drift zone 11 is for example between $1E12$ cm$^{-3}$ and $1E14$ cm$^{-3}$, the doping concentrations of the source zones 13 and of the drain zone 14 are for example above $10^{19}$ cm$^{-3}$ and the doping concentration of the body zones 12 is for example between $1E16$ cm$^{-3}$ and $1E18$ cm$^{-3}$.

The semiconductor component illustrated in FIG. 10 is embodied as a diode and differs from the MOS transistor illustrated in FIG. 9 substantially in that, instead of the transistor cell array, an emitter 12 is present in the inner region 110. Said emitter 12 is formed by the second component zone 12 explained above. A base of the diode is formed by the first component zone 11, which is doped complementarily to the emitter 12. The component additionally comprises a further emitter 51, which is separated from the emitter 12 by the base 11. The base 11 is n-doped, for example. The emitter 12 is p-doped, for example, and forms an anode zone of the diode, moreover a further emitter 51 is n-doped, for example, and forms a cathode zone of the diode. In this case, the further emitter 51 is more highly doped than the base 11. The doping concentration of the base 11 can correspond for example to the doping concentration of the drift zone 11 according to FIG. 9. The doping concentrations of the two emitters 12, 51 are more than $1E19$ cm$^{-3}$, for example.

The above-explained edge termination structure comprising the passivation layer is, of course, not restricted to being realized in a diode, a MOSFET or an IGBT. Said edge termination structure 40 can be realized in any type of semiconductor component, in particular in any type of vertical semiconductor component. Other types of semiconductor components in which the edge termination structure can be implemented are for example bipolar junction transistors (BJTs) or thyristors.

The invention claimed is:

1. A semiconductor component comprising:
   a semiconductor body comprising an inner zone and an edge zone; and
   a passivation layer, which is arranged at least on a surface of the semiconductor body adjoining the edge zone, which comprises a semiconductor oxide and which comprises a defect region having crystal defects that serve as getter centers for contaminations.

2. The semiconductor component as claimed in claim 1, wherein the passivation layer comprises:
   a first sublayer adjoining the semiconductor body in the region of the first surface; and
   a second sublayer on the first sublayer, wherein the defect region is arranged in the second sublayer.

3. The semiconductor component as claimed in claim 1, wherein a concentration of crystal defects in the at least one defect region is greater than $1E14$.

4. The semiconductor component as claimed in claim 1, wherein a concentration of crystal defects in the first passivation layer is less than $1E13$ cm$^{-3}$.

5. The semiconductor component as claimed in claim 1, wherein the crystal defects comprise one or a plurality of the following defects:
- lattice displacements;
- lattice strains;
- precipitates of impurity atoms.

6. The semiconductor component as claimed in claim 1, wherein the passivation layer comprises at least one of the following materials:
- silicon oxide;
- BPSG;
- PSG;
- BSG; and
- SG (silicate glass).

7. The semiconductor component as claimed in claim 1, further comprising:
- at least one rectifying junction in the inner zone.

8. The semiconductor component as claimed in claim 7, wherein the rectifying junction is one of the following:
- a pn junction between complementarily doped semiconductor zones;
- a Schottky junction.

9. The semiconductor component as claimed in claim 7, further comprising:
- a cell array having a plurality of transistor cells in the inner zone;
- wherein each transistor cell comprises a pn junction between a body zone and a drift zone and a gate electrode insulated from the body zone by a gate dielectric.

10. The semiconductor component as claimed in claim 1, wherein the passivation layer is applied to two surfaces which adjoin one another and which form an angle of greater than or equal to 90°.

11. The semiconductor component as claimed in claim 1, wherein the edge region surrounds the inner region in a ring-shaped fashion in a horizontal plane of the semiconductor body.

12. The semiconductor component as claimed in claim 1, wherein the passivation layer is also arranged above the inner region on the semiconductor body.

13. The semiconductor component as claimed in claim 1, further comprising:
- an edge termination structure in the edge region.

14. A method for producing a semiconductor component comprising a semiconductor body having an inner region and an edge region, comprising:
- producing a passivation layer at least on a surface of the semiconductor body adjoining the edge zone,
- wherein the passivation layer comprises a semiconductor oxide and comprises a defect region having crystal defects that serve as getter centers for contaminations.

15. The method as claimed in claim 14, wherein producing the passivation layer comprises:
- producing an oxide layer on the at least one surface; and
- carrying out a damage implantation, wherein particles are implanted into the oxide layer in order thereby to produce the defect regions.

16. The method as claimed in claim 15, wherein the oxide layer comprises at least one of the following materials:
- silicon oxide;
- BPSG;
- PSG;
- BSG; and
- SG.

17. The method as claimed in claim 15, wherein the particles comprise at least one of the following types of particles:
- semiconductor atoms,
- oxygen atoms,
- argon atoms,
- helium atoms,
- protons and
- phosphorus atoms.

18. The method as claimed in claim 15, wherein an implantation dose of the particles is between $1E13$ $cm^{-2}$ and $1E16$ $cm^{-2}$.

19. The method as claimed in claim 15, wherein an implantation energy of the damage implantation is between 100 keV and 4 MeV or between 170 keV and 3 MeV.

20. The method as claimed in claim 15, wherein a thickness of the oxide layer is between 100 nanometers and 5 micrometers or between 200 nanometers and 2 micrometers.

21. The method as claimed in claim 14, wherein producing the passivation layer comprises:
- producing a first passivation layer by means of a plasma deposition method.

22. The method as claimed in claim 21, wherein the first passivation layer comprises at least one of the following materials:
- silicon oxide;
- BPSG;
- PSG;
- BSG; and
- SG.

23. The method as claimed in claim 21, wherein the first passivation layer is produced in a manner adjoining the at least one surface.

24. The method as claimed in claim 21, wherein producing the passivation layer further comprises:
- producing a second passivation layer adjoining the at least one surface, and
- producing the first passivation layer on the second passivation layer.

25. The method as claimed in claim 24, wherein the second passivation layer is a thermal oxide layer.

26. The method as claimed in claim 21, wherein the second passivation layer comprises at least one of the following materials:
- silicon oxide;
- BPSG;
- PSG;
- BSG; and
- SG.

* * * * *

UNITED STATES PATENT AND TRADEMARK OFFICE
CERTIFICATE OF CORRECTION

PATENT NO. : 9,177,829 B2  
APPLICATION NO. : 14/485852  
DATED : November 3, 2015  
INVENTOR(S) : Schulze et al.

Page 1 of 1

It is certified that error appears in the above-identified patent and that said Letters Patent is hereby corrected as shown below:

In the claims

Column 10, Claim 3, Line 64 replace "...than 1E14." with --...than 1E14 $cm^{-3}$.--

Signed and Sealed this  
Eighth Day of March, 2016

Michelle K. Lee  
*Director of the United States Patent and Trademark Office*